(12) United States Patent
Morishita et al.

(10) Patent No.: US 10,241,394 B2
(45) Date of Patent: Mar. 26, 2019

(54) PATTERN FORMATION METHOD, CONTROL DEVICE, AND SEMICONDUCTOR DEVICE MANUFACTURE METHOD

(71) Applicant: TOSHIBA MEMORY CORPORATION, Tokyo (JP)

(72) Inventors: Keiko Morishita, Kanagawa (JP);
Shingo Kanamitsu, Kanagawa (JP);
Hideaki Sakurai, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 155 days.

(21) Appl. No.: 14/848,075

(22) Filed: Sep. 8, 2015

(65) Prior Publication Data
US 2016/0259240 A1 Sep. 8, 2016

(30) Foreign Application Priority Data
Mar. 4, 2015 (JP) ................. 2015-042769

(51) Int. Cl.
| G03F 1/72 | (2012.01) |
| G03F 1/74 | (2012.01) |
| G03F 1/80 | (2012.01) |

(52) U.S. Cl.
CPC ............. *G03F 1/72* (2013.01); *G03F 1/74* (2013.01); *G03F 1/80* (2013.01)

(58) Field of Classification Search
CPC ..... G03F 1/72; G03F 1/74; G03F 1/80; G03F 7/0035
USPC .................................. 430/324, 323
See application file for complete search history.

(56) References Cited

U.S. PATENT DOCUMENTS 5,614,336 A   3/1997   Mikami et al.

FOREIGN PATENT DOCUMENTS

| JP | 2-1850 | 1/1990 |
| JP | 4-131853 | 5/1992 |
| JP | 11-307440 | 11/1999 |

*Primary Examiner* — Daborah Chacko-Davis
(74) *Attorney, Agent, or Firm* — Finnegan, Henderson, Farabow, Garrett & Dunner, L.L.P.

(57) ABSTRACT

In a pattern formation method according to an embodiment, a resist pattern is formed on a first film formed on a substrate. In the process for forming the resist pattern, the resist pattern includes a first pattern including a defect in a predetermined region on the first film. Next, a second film is accumulated on the first pattern in the predetermined region. Furthermore, a second pattern is formed in the first film with the resist pattern and the second film. Then, a third pattern is formed in the predetermined region on the first film.

10 Claims, 7 Drawing Sheets

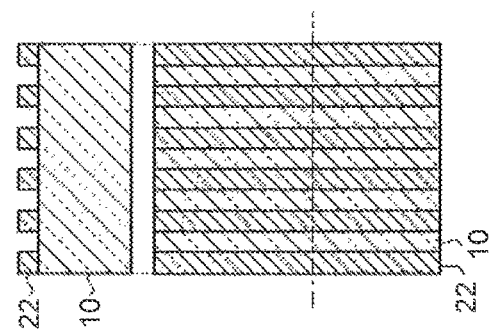
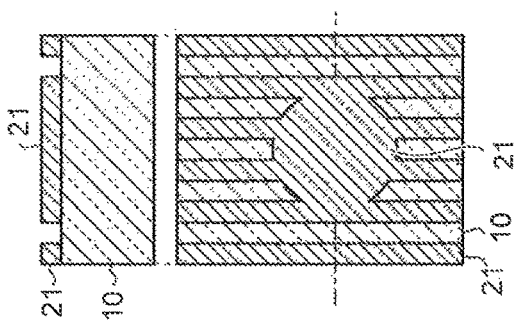
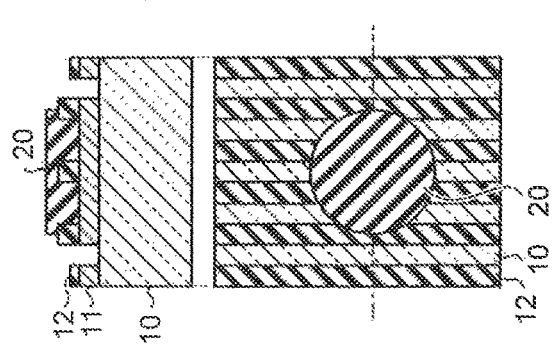
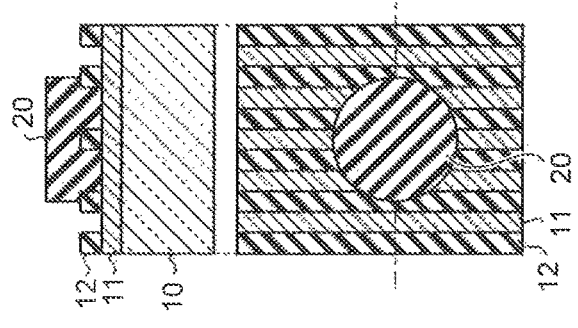
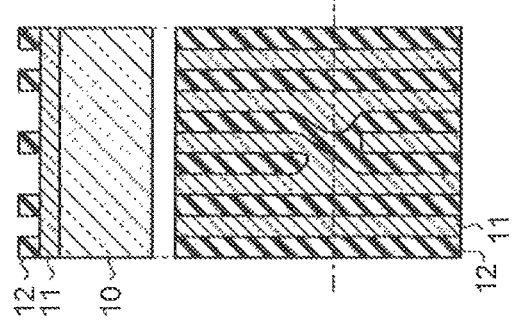

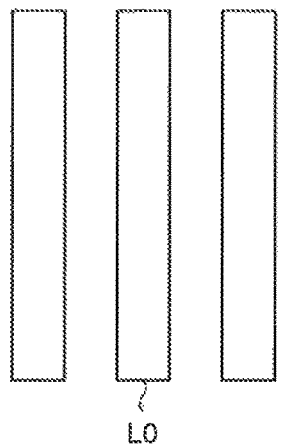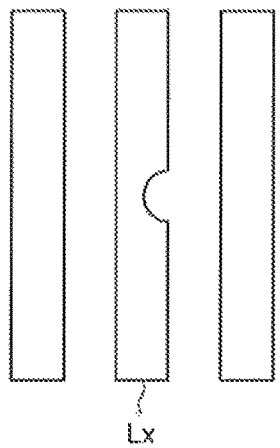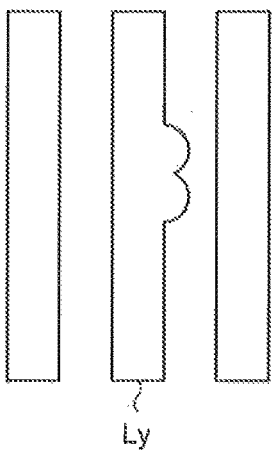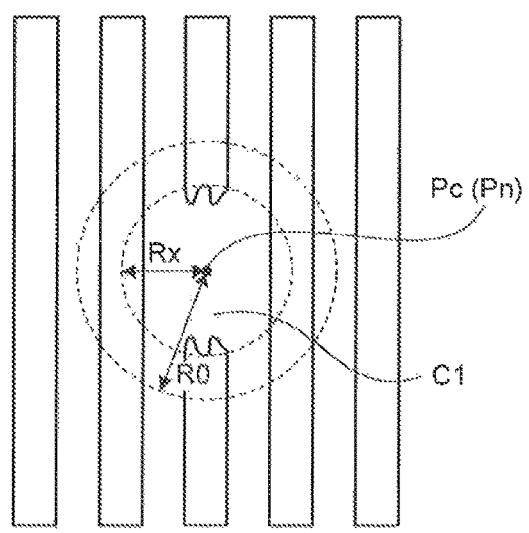

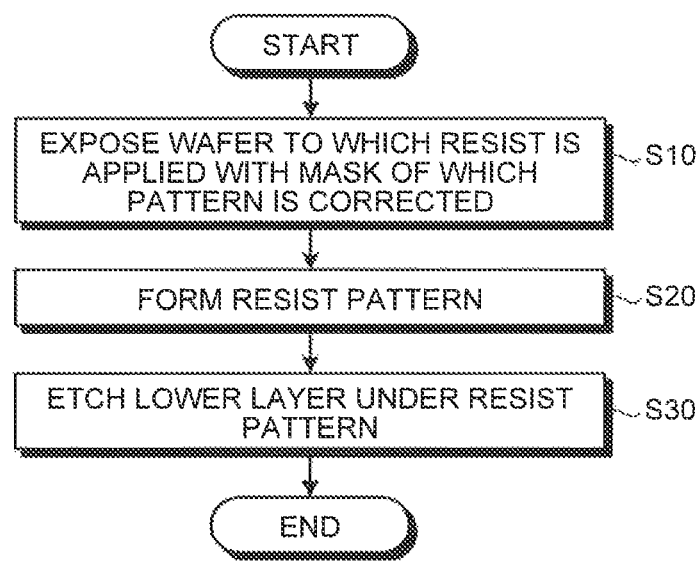
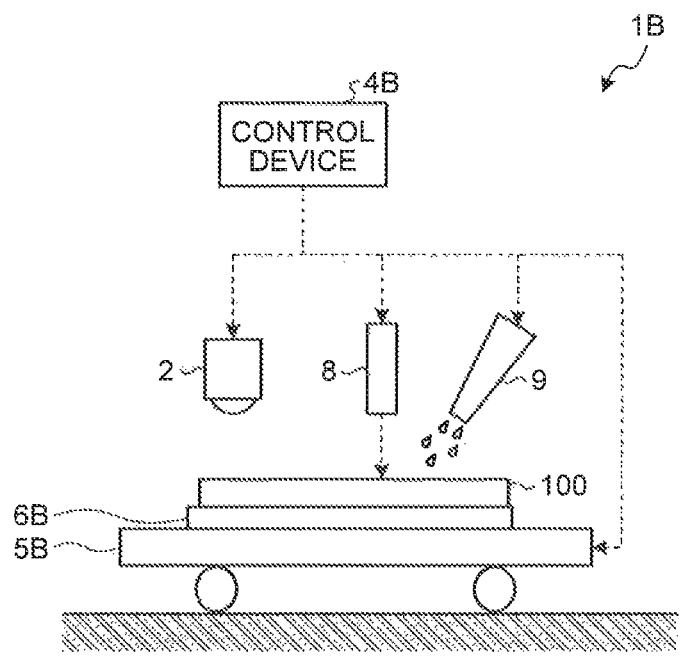

PATTERN FORMATION METHOD, CONTROL DEVICE, AND SEMICONDUCTOR DEVICE MANUFACTURE METHOD

CROSS-REFERENCE TO RELATED APPLICATIONS

This application is based upon and claims the benefit of priority from Japanese Patent Application No. 2015-042769, filed on Mar. 4, 2015; the entire contents of which are incorporated herein by reference.

FIELD

Embodiments described herein relate generally to a pattern formation method, a control device, and a semiconductor device manufacture method.

BACKGROUND

It is necessary to form a pattern without a defect on a photomask used for the lithography process or on a template (original board) used for the imprint process in the manufacture of semiconductors. Thus, such a pattern defect is corrected when a photomask or a template is manufactured.

For example, in the process for manufacturing the photomask, a desired pattern is drawn on a resist film on a mask substrate, and the pattern is subsequently formed on the mask substrate by etching. After that, if a pattern defect is detected with a defect inspection apparatus, the detected pattern defect is corrected, for example, with a charged particle beam correction apparatus.

A defect caused by a film residue or under-etching on the desired pattern is referred to as a black defect. On the other hand, a defect caused by a film deficit or over-etching on the desired pattern is referred to as a white defect.

Techniques satisfying processing accuracy requirements have been established to correct of a pattern with a black defect. However, when a pattern with a white defect is corrected, it is difficult to form a desired pattern shape using the same material, as the substrate with a nanometer-scale accuracy.

BRIEF DESCRIPTION OF THE DRAWINGS

FIGS. 1A to 1E are diagrams of a process of a pattern formation method according to a first embodiment;

FIGS. 2A to 2C are explanatory diagrams of a white defect and a black defect;

FIG. 3 is an explanatory diagram of the drop position on which protectant is to be dropped;

FIG. 9 is a flowchart of a semiconductor device manufacture process;

FIG. 10 is a diagram of the configuration of a pattern formation apparatus according to a second embodiment;

DETAILED DESCRIPTION

Figure 4:
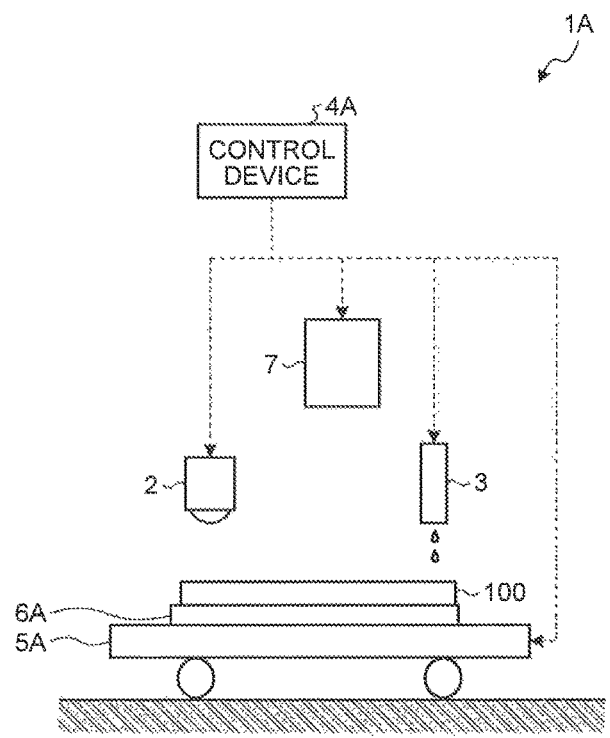
FIG. 4 is a diagram of the configuration of a pattern formation apparatus according to the first embodiment.

According to an embodiment, a pattern formation method is provided. In the pattern formation method, a resist pattern is formed on a first film formed on a substrate. In the process for forming the resist pattern, the resist pattern includes a first pattern including a defect in a predetermined region on the first film. Next, a second film is accumulated on the first pattern in the predetermined region. Furthermore, the first film is formed into a second pattern in accordance with the resist pattern and the second film. Then, a third pattern is formed in the predetermined region on the first film.

The pattern formation methods, control devices, and semiconductor device manufacture methods according to the embodiments will be described in detail with reference to the appended drawings. Note that the present invention is not limited to the embodiments. The diagrams schematically illustrate the embodiments and do not show the actual proportion among the sizes of the components.

(First Embodiment)

FIGS. 1A to 1E are diagrams of a process of the pattern formation method according to a first embodiment. Each of FIGS. 1A to 1E illustrates a cross-sectional view of a substrate in the upper part, and a top view of the substrate in the lower part. Each of the cross-sectional views in FIGS. 1A to 1E is taken along the dotted line of the top view in the lower part.

In the present embodiment, a pattern formation apparatus 1A described below accumulates a protection film on a region including a white defect on a substrate. Etching the substrate from above the protection film forms a pattern including a black defect on the substrate. After that, the pattern including the black defect is corrected, for example, with a charged particle beam correction apparatus.

An object (a substrate) of which pattern is to be corrected is, for example, a resist pattern on a mask blanks (a lithography original board). The mask blanks includes a silica glass substrate 10, and a light blocking film 11 formed on the silica glass substrate 10. The light blocking film 11 is, for example, a chrome (Cr) film or a chrome/tantalum (Cr/Ta) film.

Patterning the light blocking film 11 forms a mask pattern on the mask blanks. The mask blanks on which a mask pattern is formed is a photomask.

When the photomask is made by the mask blanks, a resist pattern 12 corresponding to the mask pattern is formed on the light blocking film 11 as illustrated in FIG. 1A. The resist pattern 12 is formed, for example, with an Electron Beam (EB) drawing apparatus and a developing apparatus.

The resist pattern 12 sometimes includes a pattern defect. The pattern defect includes a pattern shape different from the desired pattern shape. The pattern defect includes a white defect (a film deficit defect) and a black defect (a film residue defect).

The white defect (a clear defect) is caused by a film deficit or over-etching occurring on the desired pattern. The black defect (an opaque defect) is caused by a film residue or under-etching occurring on the desired pattern.

FIGS. 2A to 2C are explanatory diagrams of a white defect and a black defect. FIG. 2A is a top view of the shape of a desired pattern L0. FIG. 2B is a top view of the shape of a white defect pattern Lx. FIG. 2C is a top view of the shape of a black defect pattern Ly.

A pattern that, for example, a film deficit occurs on the desired pattern L0 is the white defect pattern Lx. A pattern that, for example, a film residue occurs on the desired pattern L0 is the black defect pattern Ly.

After the resist pattern 12 is formed, the pattern format ion apparatus 1A extracts the positional information indicating the position of the pattern defect on the resist pattern 12. In the present embodiment, the region in which the white defect occurs is extracted as the positional information about the white defect region. The white defect region encompasses the whole white defect and is, for example, a circular region.

Subsequently, a protection film (accumulated film) 20 is formed on the white defect region on the resist pattern 12 as illustrated in FIG. 1B. The protection film 20 protects the light blocking film 11 during etching. The protection film 20 may be a resist made of resins, or a film other than a resist. The protection film 20 is made, for example, of the same material as the resist pattern 12.

The pattern formation apparatus 1A drops protectant (droplets) on the white defect region in an ink-jet manner. This dropping accumulates the protection film 20. The pattern formation apparatus 1A drops the protectant on the white defect region so as to cover the whole of the white defect region with the protection film 20. In other words, the protection film 20 is formed in such a way as to entirely cover the white defect.

After that, the light blocking film 11 is etched while the resist pattern 12 and the protection film 20 are used as masks. Accordingly, the light blocking film 11 is etched and removed in the region in which both of the resist pattern 12 and the protection film 20 are not formed, namely, the region except for the region in which the protection film 20 is formed as illustrated in FIG. 1C. On the other hand, the light blocking film 11 remains in the region in which at least one of the resist pattern 12 and the protection film 20 is formed.

After that, the resist pattern 12 and the protection film 20 are removed, and a light blocking film pattern 21 corresponding to the resist pattern 12 and the protection film 20 remains on the silica glass substrate 10 as illustrated in FIG. 1D. As a result, the pattern corresponding to the resist pattern 12 and the protection film 20 is transferred to the light blocking film pattern 21.

The region corresponding to the protection film 20 in the light blocking film pattern 21 includes the black defect. In other words, the pattern defect in the light blocking film pattern 21 includes only the black defect, and does not include the white defect. Thus, the pattern including the black defect is corrected, for example, with a charged particle beam correction apparatus. This correction forms the light blocking film pattern 22 without a pattern defect as illustrated in FIG. 1E. As a result, the photomask of which pattern defect is corrected with a high degree of accuracy is formed.

In the pattern formation method according to the present embodiment, it is not necessary to form a resist pattern again after the resist pattern 12 is formed. Thus, the photomask can easily be formed. Furthermore, the pattern defect can easily be corrected with the process for forming the protection film 20 and the process for correcting the black defect even in the region in which both of the white defect and the black defect occur.

The drop position to which the protectant is to be dropped will be described hereinafter. FIG. 3 is an explanatory diagram of the drop position of the protectant. The protectant (droplets) ejected in an ink-jet manner forms the protection film 20 into a circular shape on the resist pattern 12. The diameter of the dropped protection film 20 is, for example, 1 to 15 μm, viewed from the top, in size.

For example, the minimum size of the protectant (the diameter of the protection film 20) to be accumulated in an ink-jet manner is R0, the central position of a white defect C1 is a center Pc, the minimum size of the circular region (the diameter of the accumulated film) necessary to encompass the whole region of the white defect C1 is Rx.

When R0>Rx holds, a size Rn to which the protection film 20 is accumulated is set such that Rn=R0 holds. In other words, when R0>Rx holds, the protection film 20 that is R0 in diameter is formed on the white defect C1. The central position Pn of the protection film 20 is the same as the center Fc of the white defect C1 at that time. Accordingly, the whole region of the white defect C1 is covered with the protection film 20.

Note that the central position Pn of the protection film 20 can be moved by a distance up to (R0−Rx)/2 from the center Fc of the white defect C1 that is the reference position. In other words, the central position Pn of the protection film 20 can be moved to any position in the range of the radius of (R0−Rx)/2 from the center Pc.

The central position Pn of the protection film 20 is set, for example, in such a way as to minimize the area of the pattern region including the black defect and generated in the next process. For example, when the black defect exists near the white defect C1, the central position Pn of the protection film 20 is set at a position such that the protection film 20 includes the white defect C1 and the black defect.

On the other hand, when R0≤Rx holds, a plurality of droplets of the protectant is dropped such that Rn (the size to which the protection film 20 is accumulated)≥Rx (the size of the white defect C1) and Pn =Pc holds. Note that, when R0≤Rx holds, the droplets of the protectant can be dropped on different positions.

By the way, the protectant is sometimes dropped at a different position from the set position on which the protectant is to be dropped. In such a case, the size Rn and central position Pn of the protection film 20 to be accumulated can be set in consideration of the gap between the positions.

The configuration of the pattern formation apparatus 1A will be described next. FIG. 4 is a diagram of the configuration of the pattern formation apparatus according to the first embodiment. The pattern formation apparatus 1A drops protectant (for example, a resist) that becomes the protection film 20, for example, on the mask blanks 100 on which the resist pattern 12 is formed. The protectant that the pattern formation apparatus 1A drops is, for example, photo-curable resins.

The pattern formation apparatus 1A drops the protectant on the mask blanks 100 in an ink-jet manner. The mask blanks 100 includes the silica glass substrate 10 and the light blocking film 11 as illustrated in FIG. 1A. The resist pattern 12 formed on the mask blanks 100 is, for example, a circuit pattern to be transferred to the mask blanks 100.

The pattern formation apparatus 1A includes a pattern detection mechanism 2, a falling-drop mechanism 3, a control device 4A, a specimen stage 5A, a substrate chuck 6A, and a UV light source 7. The pattern detection mechanism 2 includes, for example, an image taking apparatus so as to detect a pattern shape formed on the surface of the mask blanks 100. The pattern detection mechanism 2, for example, takes an image of the resist pattern 12 and transmits the taken result (the resist pattern image) to the control device 4A.

The falling-drop mechanism 3 drops the protectant on the surface of the mask blanks 100 in an ink-jet manner. The ink-let head (not illustrated) of the falling-drop mechanism 3 includes fine pores from which the droplets of protectant are ejected. The falling-drop mechanism 3 drops the protectant on the position that the control device 4A indicates on the mask blanks 100.

The specimen stage 5A is used to place the mask blanks 100 thereon and moves in a plane (a horizontal plane) parallel to the placed mask blanks 100. The substrate chuck 6A is provided on the specimen stage 5A. The substrate chuck 6A fixes the mask blanks 100 at a predetermined position on the specimen stage 5A.

The UV light source 7 emits a UV light, and is provided above the substrate chuck 6A. The UV light source 7 irradiates the protectant on the mask blanks 100 with the UV light. The protectant cures by the UV light irradiation and becomes the protection film 20.

The control device 4A is connected to each of the components of the pattern formation apparatus 1A so as to control the components. The control device 4A controls, for example, the pattern detection mechanism 2, the falling-drop mechanism 3, the specimen stage 5A, and the UV light source 7.

When the pattern on the mask blanks 100 is formed (corrected), the mask blanks 100 is fixed on the substrate chuck 6A. Then, the pattern detection mechanism 2 takes an image of the resist pattern 12 formed on the surface of the mask blanks 100 and transmits the taken resist pattern image to the control device 4A.

The control device 4A detects a white defect region in accordance with the resist pattern image transmitted from the pattern detection mechanism 2. The control device 4A, subsequently, sets the drop position to which the protectant is to be dropped in accordance with the white defect region, and transmits the set drop position to the falling-drop mechanism 3.

Accordingly, the falling-drop mechanism 3 drops the protectant on the drop position that the control device 4A indicates. When the protectant is dropped on the mask blanks 100, the mask blanks 100 placed on the specimen stage 5A moves just under the falling-drop mechanism 3. Then, the falling-drop mechanism 3 drops the protectant on a predetermined position in the mask blanks 100.

The protectant dropped on the mask blanks 100 cures by the UV light irradiation from UV light source 7 and becomes the protection film 20. The pattern formation apparatus 1A repeats the dropping of protectant and the UV light irradiation alternately. Note that the protectant may be dropped on a plurality of places and then the places may collectively be irradiated with the UV light.

Figure 5:
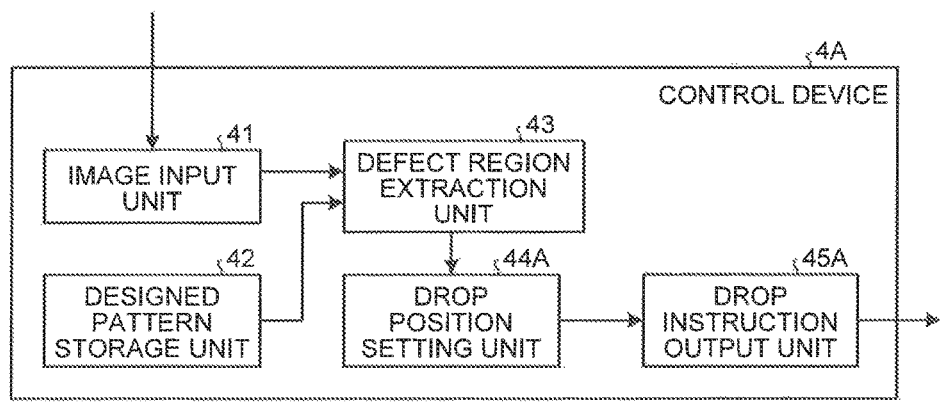
FIG. 5 is a diagram of the configuration of a control device according to the first embodiment.

The configuration of the control device 4A will be described next. FIG. 5 is a diagram of the configuration of the control device according to the first embodiment. The control device 4A includes an image input unit 41, a designed pattern storage unit 42, a defect region extraction unit 43, a drop position setting unit 44A, and a drop instruction output unit 45A.

The image input unit 41 receives the resist pattern image transmitted from the pattern detection mechanism 2, and passes the resist pattern image to the defect region extraction unit 43. The designed pattern storage unit 42 is, for example, a memory that stores the designed layout of a mask pattern (the resist pattern 12) to be formed on the mask blanks 100. The designed layout is data indicating the shape, position, and dimension of a desired pattern. The resist pattern 12 is formed into the shape, position, and dimension indicated in the designed layout. Thus, a resist pattern 12 without a pattern defect has a pattern shape approximately identical to the pattern shape of the designed layout.

The defect region extraction unit 43 extracts defect information about the white defect region in accordance with the resist pattern image transmitted from the image input unit 41 and the designed layout in the designed pattern storage unit 42. Specifically, the defect region extraction unit 43 compares the resist pattern image with the designed layout. Subsequently, the defect region extraction unit 43 extracts information about the pattern that is included in the designed layout and is not included in the resist pattern 12 as the defect information about the white defect region from the resist pattern 12. In other words, the defect region extraction unit 43 compares the resist pattern 12 with the designed layout so as to extract the place in which, for example, a film deficit occurs as the defect information about the white defect region from the resist pattern 12.

The defect region extraction unit 43 compares the resist pattern 12 with the designed layout so as to extract the place in which, for example, a film residue occurs as defect information about the black defect region from the resist pattern 12. Specifically, the defect region extraction unit 43 compares the resist pattern image with the designed layout. Subsequently, the defect region extraction unit 43 extracts information about the pattern that is included in the resist pattern 12 and is not included in the designed layout as the defect information about the black defect region from the resist pattern 12. In other words, the defect region extraction unit 43 compares the resist pattern 12 with the designed layout so as to extract the place in which, for example, a film residue occurs as the black defect region from the resist pattern 12.

The defect region extraction unit 43 transmits the extracted defect information about the white defect region and the black defect region to the drop position setting unit 44A. The defect information includes the shape, position, and dimension of the white defect, and the shape, position, and dimension of the black defect.

The drop position setting unit 44A sets the drop position on which the protectant is to be dropped in the resist pattern 12 in accordance with the defect information about the white defect region and the black defect region. The drop position setting unit 44A sets the drop position of the protectant such that the white defect to be covered is entirely covered and the area of the black defect after etching is minimized.

When the black defect is not around the white defect, the drop position setting unit 44A sets the center of the drop position at a position such that the protection film 20 widely covers the resist pattern 12. For example, when the distance between the white defect and the black defect is longer than a predetermined value and the center of the drop position is set at a position such that the protection film 20 entirely covers the white defect, it may be impossible for the protection film 20 to cover even a part of the black defect. In such a case, the drop position setting unit 44A sets the center of the drop position at a position such that the white defect is entirely covered and the resist pattern 12 is covered as widely as possible.

On the other hand, when the black defect is around the white defect, the drop position setting unit 44A sets the center of the drop position at a position such that the protection film 20 widely covers the black defect and the resist pattern 12. For example, when the distance between the white defect and the black defect is shorter than a predetermined value, setting the center of the drop position at a position such that the white defect is entirely covered sometimes enables the protection film 20 to cover a part of the black defect. In such a case, the drop position setting unit 44A sets the center of the drop position at a position such that the white defect is entirely covered and the black defect and the resist pattern 12 are covered as widely as possible.

If there is a white defect region larger than a predetermined area, the drop position setting unit 44A sets a plurality of drop positions for the white defect region larger than the predetermined area. For example, if the diameter of the minimum circular region that can encompass a white defect region is larger than that of the protection film 20, the drop position setting unit 44A sets a plurality of drop positions for the white defect region. In such a case, the drop position setting unit 44A can set the drop positions at the same coordinates or different coordinates.

The drop position setting unit 44A transmits the set drop position and the set number of droplets at the drop position to the drop instruction output unit 45A. The drop instruction output unit 45A outputs an instruction to drop the protectant on the drop position transmitted from the drop position setting unit 44A (the drop instruction). The drop instruction output from the instruction output unit 45A is transmitted to the falling-drop mechanism 3.

When the protectant is dropped on the resist pattern 12, the pattern detection mechanism 2 takes an image of the resist pattern 12 and transmits the image to the image input unit 41. Then, the defect region extraction unit 43 extracts the defect information about the white defect region and the black defect region in accordance with the resist pattern image and the designed layout. Furthermore, the drop position setting unit 44A sets the drop position of the protectant on the resist pattern 12 in accordance with the defect information about the white defect region and the black defect region. Then, the drop instruction output unit 45A transmits the instruction to drop the protectant on the set drop position to the falling-drop mechanism 3.

An example in which the substrate of which pattern is corrected is the mask blanks of a transmission mask is described in the present embodiment. Note that, however, the substrate of which pattern is corrected may be the mask blanks of a reflection mask.

Figure 6:
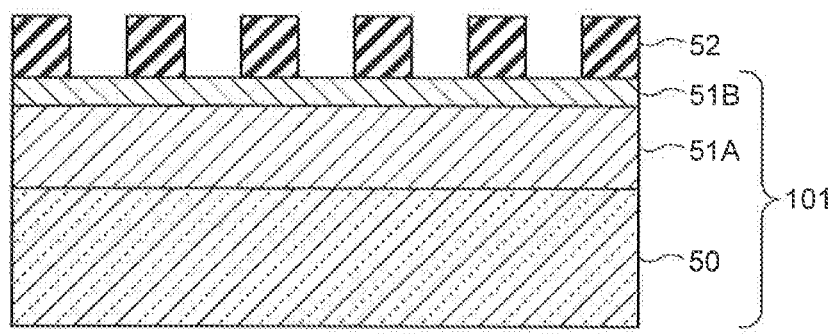
FIG. 6 is a diagram of the structure of mask blanks of a reflection mask.

FIG. 6 is a diagram of the structure of the mask blanks of a reflection mask. A mask blanks 101 is an original board used to form a reflection mask. The reflection mask is, for example, an Extreme Ultraviolet Lithography (EUV) mask used for EUV exposure.

The mask blanks 101 includes a silica glass substrate 50, an EUV reflection film 51A, and an absorption film 51B. In the mask blanks 101, the SUV reflection film 51A is formed on the silica glass substrate 50, and the absorption film 51B is formed on the EUV reflection film 51A.

The EUV reflection film 51A is made, for example, by a molybdenum silicide (MoSi) multi-layer film so as to reflect an EUV light. The absorption film 51B is made, for example, of tantalum (Ta) so as to absorb the EUV light.

Patterning the absorption film 51B of the mask blanks 101 forms the EUV mask. When the absorption film 51B is patterned, a resist pattern 52 is formed on the absorption film 51B. Meanwhile, the pattern formation apparatus 1A extracts a white defect region and a black defect region from the resist pattern 52, and forms the protection film 20 on the white defect region. Then, the absorption film 51B is etched from above the resist pattern 52 and the protection film 20. After that, the pattern including the black defect is corrected on the absorption film 51B.

The mask blanks 100 can be not only a mask blanks used to form a binary mask but also a mask blanks to form a half-tone mask. In such a case, the mask blanks 100 is provided with a half-tone (semi-transmission) film such as an MoSi film instead of the light blocking film 11.

Figure 7:
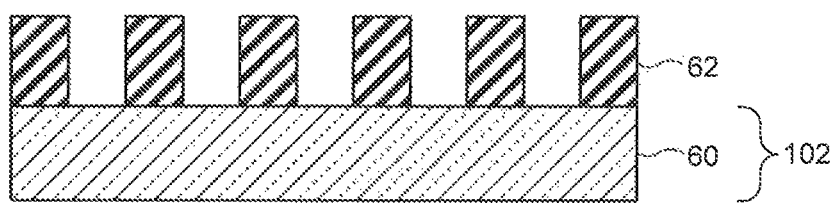
FIG. 7 is a diagram of the structure of the mask blanks for Imprint lithography.

The substrate of which pattern is to be corrected may be an imprinting blanks used for Nano Imprint lithography (NIL). FIG. 7 is a diagram of the structure of the mask blanks for Imprint lithography. An imprinting blanks 102 is an original board of a template used for the imprinting process.

The imprinting blanks 102 includes a silica glass substrate 60. Forming a concavo-convex pattern (template pattern) on the imprinting blanks 102 forms a template.

When the concavo-convex pattern is formed on the imprinting blanks 102, a resist pattern 62 is formed on the imprinting blanks 102. Meanwhile, the pattern formation apparatus 1A extracts the defect information about a white defect region and a black defect region from the resist pattern 62 so as to form the protection film 20 on the white defect region. Then, the imprinting blanks 102 is etched from above the resist pattern 62 and the protection film 20. This etching forms the concavo-convex pattern. After that, the black defect of the concavo-convex pattern is corrected.

Note that, for example, a hard mask layer that works as a hard mask during the etching may be formed on the imprinting blanks 102. The hard mask layer is, for example, a chrome layer. When a hard mask layer is placed on the imprinting blanks 102, the resist pattern 62 is formed on the hard mask. Then, the pattern formation apparatus 1A forms the protection film 20 on the white defect region of the resist pattern 62. After that the hard mask layer is etched from above the resist pattern 62 and the protection film 20. Subsequently, the black defect of the pattern formed on the hard mask layer is corrected. After that, the imprinting blanks 102 is etched from above the hard mask layer. This etching forms the concavo-convex pattern. Note that the black defect of the concavo-convex pattern may be corrected. In such a case, the black defect of the pattern formed on the hard mask layer does not need to be corrected.

The patterns, such as the resist patterns 12, 52, and 62, may be formed in a method other than EB lithography. The resist patterns 12, 52, and 62 may be formed, for example, with X-ray lithography, photolithography, EUV lithography, imprint lithography, or a Directed Self-Assembly (DSA) technique.

Figure 8:
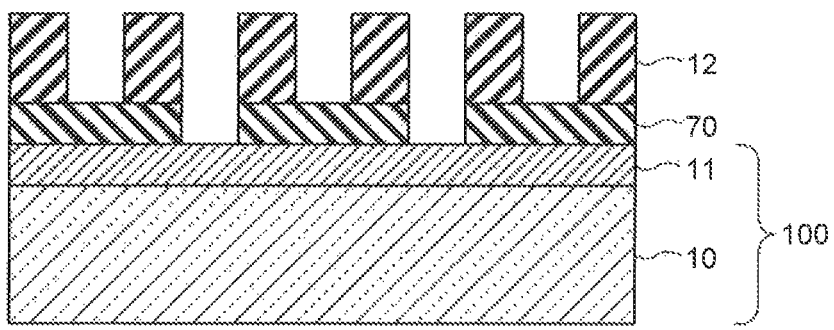
FIG. 8 is an explanatory diagram of a resist pattern formed with a DSA technique.

FIG. 8 is an explanatory diagram of a resist pattern formed with a DSA technique. The resist patterns 12, 52, and 62 have the same structure. Thus, a case in which the resist pattern 12 is formed on the mask blanks 100 with the DSA technique will be described hereinafter.

When a DSA process using Directed Self-Assembly is performed, a guide pattern (neutralization film) 70 is formed on the mask blanks 100. The guide pattern 70 is a pattern in accordance with the shape and dimension of the resist pattern 12 to be formed.

After the guide pattern 70 is formed, a DSA material is applied to the guide pattern 70. Accordingly, lipophilic parts and hydrophilic parts of the DSA material are collected at the positions in accordance with the guide pattern 70, respectively. Then, one of the collected lipophilic part and the collected hydrophilic part is removed by etching and thus the other part remains. As a result, the resist pattern 12 is formed by the assembly of the lipophilic parts or the hydrophilic parts. The pattern of the photomask formed with the DSA technique is also corrected in the process described with reference, for example, to FIGS. 1A to 1E.

Note that the pattern of the guide pattern 70 may be corrected. In such a case, the protection film 20 is formed on the white defect region of the resist pattern used to form the guide pattern 70.

The pattern formation apparatus 1A corrects a pattern, for example, for each layer in the wafer process. Consequently, a semiconductor device (semiconductor integrated circuit) is manufactured, for example, with a mask such as a photomask or an EUV mask of which pattern is corrected as necessary.

FIG. 9 is a flowchart of a semiconductor device manufacture process. The wafer to which a resist is applied is exposed with a mask of which pattern is corrected (Step S10). After that, the wafer is developed and thus the resist pattern is formed on the wafer (step S20). Note that, to perform NIL, a template of which pattern is corrected is used on the wafer to which a resist is applied.

After the resist pattern is formed, the resist pattern is used as a mask to etch a lower layer under the resist pattern (step S30). This forms an actual pattern corresponding to the resist pattern formed on the wafer. To manufacture a semiconductor device, the pattern correction, the exposing process, the developing process, the etching process, and the like are repeated on each layer.

A case in which the pattern formation apparatus 1A extracts the defect information about the white defect region and the black defect region is described in the present embodiment. Note that, however, an apparatus (a defect inspection apparatus) different from the pattern formation apparatus 1A can extract the defect information about the white defect region and the black defect region. In such a case, the pattern formation apparatus 1A does not need to include the image input unit 41 and the designed pattern storage unit 42. The pattern formation apparatus 1A sets the drop position on which the protectant is to be dropped, using the white defect region and black defect region obtained from the defect inspection apparatus.

Furthermore, the drop position setting unit 44A can set the drop position of the protectant on the resist pattern 12 in accordance with the information about the white defect region without the information about the black defect region.

A case in which the number of droplets of the protectant to be dropped on a white defect region is set in accordance with the defect information is described in the present embodiment. The drop position setting unit 44A, however, can set the amount of protectant to be dropped on a white defect region in accordance with the defect information. In such case, the falling-drop mechanism 3 drops the protectant by the amount in accordance with the instruction from the control device 4A.

As described above, the protection film 20 is accumulated on the region including the white defect detected on the resist pattern 12, and the resist pattern 12 is etched from above the protection film 20 in the present embodiment. The pattern including the black defect is corrected after the etching.

In the correcting method according to the present embodiment, it is only required that the pattern including the black defect is corrected. This can make it easy to correct the pattern of the photomask or the template. As a result, it is not necessary to create the photomask or the template again.

When a white defect in a template used for NIL is corrected with a conventional method, the difference between the concavity and convexity of the pattern is larger than the difference on the template pattern. In such a case, the larger difference makes it difficult to obtain the resist pattern having a desired film thickness when the template is pressed to the resist. On the other hand, a black defect is corrected in the present embodiment. Thus, the difference between the concavity and convexity of the pattern is not larger than the difference on the template pattern. Thus, according to the present embodiment, by pressing the template to the resist, a resist pattern having a desired film thickness can be provided.

As described above, the pattern formation apparatus 1A extracts the defect of the substrate pattern (for example, the resist pattern 12) formed on the substrate as the defect information about the white defect in the first embodiment. Subsequently, the pattern formation apparatus 1A accumulates the protection film 20 on the white defect region. Furthermore, by transferring the substrate pattern and the protection film 20 on the substrate, a transfer pattern (for example, the light blocking film pattern 21) is formed. The pattern including a black defect in the transfer pattern is corrected.

As described above, the protection film 20 is accumulated on the white defect region. Thus, a white defect does not occur on the transfer pattern. Accordingly, the pattern correction is only the correction of the pattern including the black defect. This allows the correction of the pattern defect with a high degree of accuracy.

(Second Embodiment)

Next, the second embodiment will be described with reference to FIGS. 10 to 13. Instead of the protection film 20, a metal film or a metal-oxide film is accumulated on the white defect region with an EB correction mechanism in the second embodiment.

FIG. 10 is a diagram of the configuration of the pattern formation apparatus according to the second embodiment. The same components illustrated in FIG. 10 as the components of the pattern formation apparatus 1A according to the first embodiment illustrated in FIG. 4 are put with the same reference signs and the overlapping descriptions are omitted.

A pattern formation apparatus 1B accumulates a protection film (a protection film 30 described below) such as a metal film, for example, on a mask blanks 100. A protection film 30 that the pattern formation apparatus 1B accumulates has the same function as that of the protection film 20. Thus, the protection film 30 can be removed from the mask blanks 100 after, for example, the light blocking film 11 is etched. The protection film 30 is resistant to etching. The protection film 30 is, for example, a metal film or a metal-oxide film. The pattern formation apparatus 13 accumulates the protection film 30, using an EB correction mechanism (a charged particle beam correction apparatus).

The pattern formation apparatus 1B includes a pattern detection mechanism 2, a control device 4B, a specimen stage 5B, a substrate chuck 6B, an EB (charged particle) irradiation mechanism 8, and a gas injection mechanism 9. Among them, the EB irradiation mechanism 8 and the gas injection mechanism 9 work as an EB correction mechanism. The pattern detection mechanism 2 takes an image of a resist pattern 12 and transmits the taken resist pattern image to the control device 43.

The specimen stage 5B is used to place the mask blanks 100 thereon and moves in a plane (a horizontal plane) parallel to the placed mask blanks 100. The substrate chuck 6B is provided on the specimen stage 5B. The substrate chuck 6B fixes the mask blanks 100 at a predetermined position on the specimen stage 5B.

The EB irradiation mechanism 8 irradiates the white defect region with a charged particle beam. Similarly, the gas injection mechanism 9 irradiates the white defect region with a process gas. The process gas that the gas injection mechanism 9 emits is irradiated with the charged particle beam and becomes the protection film 30 (a metal film or a metal-oxide film). The EB correction mechanism accumulates the protection film 30 on the white defect region by reacting the charged particle beam with the process gas.

The control device 4B is connected to each of the components of the pattern formation apparatus 1B so as to control the components. The control device 4B controls, for example, the pattern detection mechanism 2, the specimen stage 5B, the EB irradiation mechanism 8, and the gas injection mechanism 9.

When the pattern on the mask blanks 100 is corrected, the mask blanks 100 is fixed on the substrate chuck 6B. Then, the pattern detection mechanism 2 takes an image of the resist pattern 12 formed on the mask blanks 100 and transmits the taken resist pattern image to the control device 4B.

The control device 4B detects the white defect region in accordance with the resist pattern image transmitted from the pattern detection mechanism 2. Subsequently, the control device 4B sets the accumulation position on which protectant is to be accumulated (or, the irradiation position that is to be irradiated with the charged particle beam and the irradiation position that is to be irradiated with the process gas) in accordance with the white defect region. The control device 4B transmits the irradiation position of the charged particle beam corresponding to the accumulation position of the protectant to the EB irradiation mechanism 8. Similarly, the control device 4B transmits the irradiation position of the process gas corresponding to the accumulation position of the protectant to the gas injection mechanism 9.

Accordingly, the EB irradiation mechanism 8 irradiates the irradiation position indicated by the control device 4B with the charged particle beam. Similarly, the gas injection mechanism 9 irradiates the irradiation position indicated by the control device 4B with the process gas.

When the EB correction mechanism accumulates the protection film 30 on the mask blanks 100, the mask blanks 100 placed on the specimen stage 5B moves just under the EB correction mechanism. Then, the EB correction mechanism accumulates the protection film 30 on a predetermined position in the mask blanks 100.

The control device 4B according to the present embodiment sets the region on which the protection film 30 is to be accumulated and the film thickness of the protection film 30 in accordance with the shape, position, and dimension of the white defect region, and the shape, position, and dimension of the black defect region. Subsequently, the control device 4B gives an instruction to accumulate the protection film 30 by a film thickness equal to or thicker than the film thickness set for the set region to the EB correction mechanism.

Figure 11:
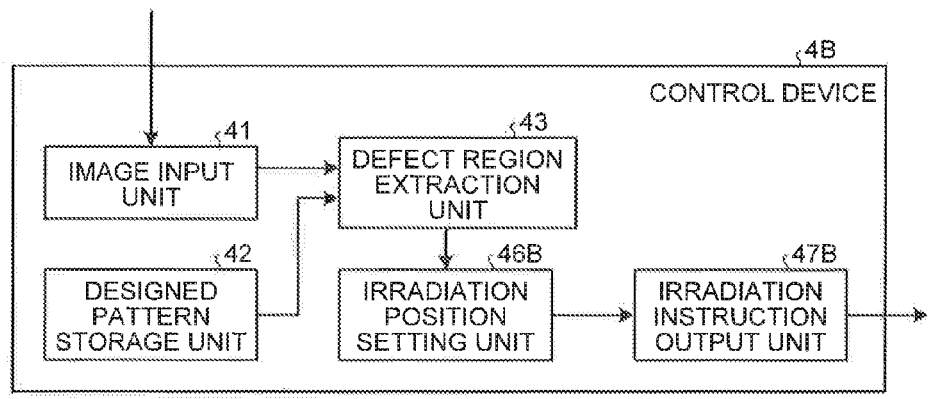
FIG. 11 is a diagram of the configuration of a control device according to the second embodiment.

FIG. 11 is a diagram of the configuration of the control device according to the second embodiment. The same components illustrated in FIG. 11 as the components of the control device 4A according to the first embodiment illustrated in FIG. 5 are put with the same reference signs and the overlapping descriptions are omitted.

The control device 4B includes an image input unit 41, a designed pattern storage unit 42, a defect region extraction unit 43, an irradiation position setting unit 46B, and an irradiation instruction output unit 47B. The defect region extraction unit 43 transmits the extracted defect information about the white defect region and the black defect region to the irradiation position setting unit 46B.

The irradiation position setting unit 46B sets the irradiation position (the irradiation region) that is to be irradiated with the charged particle beam and the process gas in accordance with the defect information. The irradiation position set by the irradiation position setting unit 46B is the accumulation position on which the protection film 30 is to be accumulated. The irradiation position setting unit 46B further sets the film thickness of the protection film 30 at the set irradiation position. The irradiation position setting unit 46B transmits the set irradiation position and film thickness to the irradiation instruction output unit 47B.

The irradiation instruction output unit 47B outputs the instruction to irradiate the irradiation position transmitted from the irradiation position setting unit 46B with the charged particle beam and the process gas (the irradiation instruction). The irradiation instruction output unit 47B outputs the irradiation instruction to irradiate the position with the charged particle beam and the process gas for a period of time appropriate for the set film thickness (the irradiation start instruction and the irradiation completion instruction).

The irradiation instruction of the charged particle beam output from the irradiation instruction output unit 47B is transmitted to the EB irradiation mechanism 8. The irradiation instruction of the process gas output from the irradiation instruction output unit 47B is transmitted to the gas injection mechanism 3.

Figure 12:
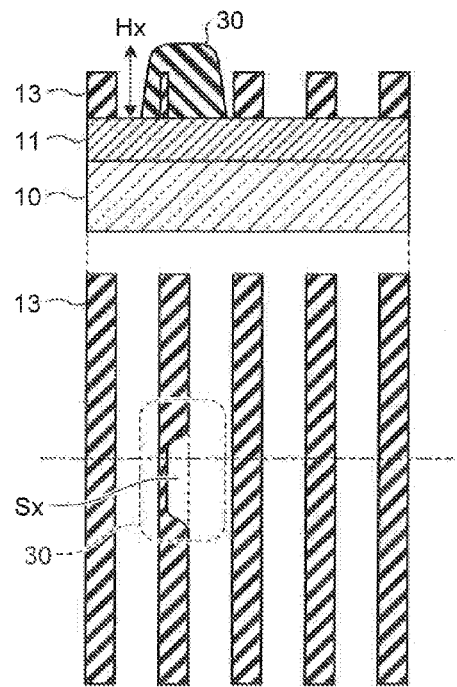
FIG. 12 is an explanatory diagram of the film thickness of a protection film, accumulated by an EB correction mechanism.

The film thickness of the protection film 30 will be described hereinafter. FIG. 12 is an explanatory diagram of the film thickness of a protection film accumulated by the EB correction mechanism. FIG. 12 illustrates a cross-sectional view of a substrate in the upper part, and a top view of the substrate in the lower part. The cross-sectional view in FIG. 12 is taken along the dotted line of the top view in the lower part.

The protection film 30 is accumulated on a white defect region Sx after a resist pattern 13 is formed on the substrate including a silica glass substrate 10 and a light blocking film 11. In such case, a film thickness necessary for the protection film 30 to be accumulated to have a resistance to etching is Hx. The value of Hx varies depending on the type of the protection film 30 and the type of the etching process.

The defect region extraction unit 43 sets a film thickness thicker than Hx to the white defect region Sx after extracting the white defect region Sx. Accordingly, the EB correction mechanism accumulates the protection film 30 on the white defect region Sx by a film thickness thicker than Hx. Note that it is required only that the white defect region Sx has the film thickness thicker than Hx as illustrated in FIG. 12 regardless of the accuracy of the film thickness.

Next, the hardware configurations of the control devices 4A and 4B will be described. Note that the hardware configuration of the control device 4A will be described hereinafter because the control devices 4A and 4B have the same hardware configuration.

Figure 13:
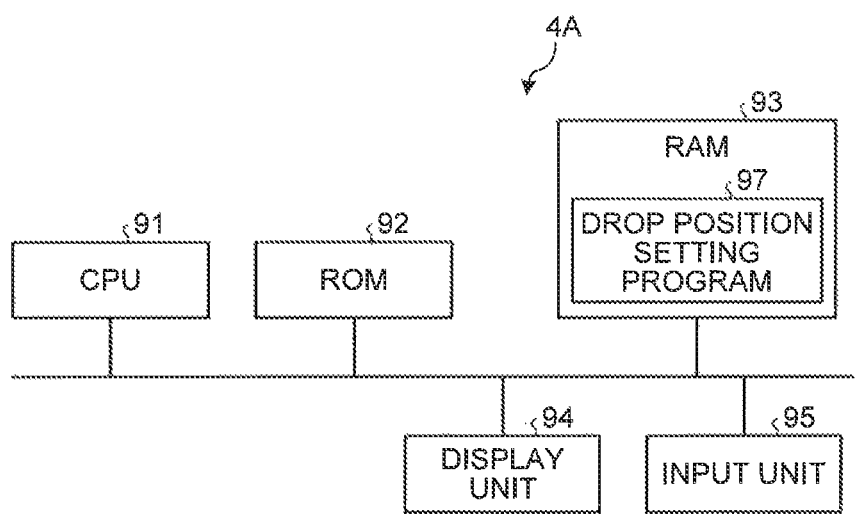
FIG. 13 is a diagram of the hardware configuration of the control device.

FIG. 13 is a diagram of the hardware configuration of the control device. The control device 4A includes; a Central Processing Unit (CPU) 91, a Read Only Memory (ROM) 92, a Random Access Memory (RAM) 93, a display unit 94, and an input unit 95. In the control device 4A, the CPU 91, the ROM 92, the RAM 93, the display unit 94, and the input unit 95 are connected to each other through a bus line.

The CPU 91 sets the drop position on which protectant is to be dropped, using a drop position setting program 97 that is a computer program. The drop position setting program 97 is a computer program product that can be executed with a computer and includes a computer readable and non-transitory recording medium (nontransitory computer readable medium) including a plurality of instructions to calculate the drop position. The drop position setting program 97 makes the computer perform the calculation of the drop position by the instructions.

The display unit 94 is, for example, a display device such as a liquid crystal monitor, and displays, for example, the designed layout, the resist pattern 12, the defect information, the protectant drop position, and the light blocking film pattern 21 in accordance with the instructions from the CPU 91. The input unit 95 includes, for example, a mouse or a keyboard so as to input the instruction information (for example, the parameters necessary for the settings of the drop position) externally input by the user. The instruction information input to the input unit 95 is transmitted to the CPU 91.

The drop position setting program 97 is stored in the ROM 92, and is loaded into the RAM 93 through the bus line. FIG. 13 illustrates that the drop position setting program 97 is loaded in the RAM 93.

The CPU 91 executes the drop position setting program 97 loaded in the RAM 93. Specifically, in the control device 4A, in accordance with the instructions input by the user through the input unit 95, the CPU 91 reads the drop position setting program 97 from the ROM 92, and develops the drop position setting program 97 into a program storage region in the RAM 93 so as to perform each process. The CPU 91 temporarily stores the various data generated in each process in a data storage region formed in the RAM 93.

The drop position setting program 97 executed in the control device 4A is a module composition including the drop position setting unit 44A. The modules are loaded and generated in the main storage unit. Note that the control device 4B described in the second embodiment sets the irradiation position of the charged particle beam and the irradiation position of the process gas, using an irradiation position setting program corresponding to the irradiation position setting unit 46B.

As described above, the protection film 30 is accumulated on a white defect with the EB correction mechanism in the second embodiment. Thus, the region on which the protection film 30 is accumulated can be limited. Accordingly, the area of the black defect caused by the protection film 30 can be reduced. As a result, the amount of the black defect to be corrected can be reduced, and thus the time to correct a pattern can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation method comprising:
   forming a resist pattern on a first film formed on a substrate, the resist pattern including a first pattern in a predetermined region, the first pattern containing a defect in a first region of the predetermined region;
   forming a protection pattern on the first pattern and the first film, the protection pattern being formed in the first region and covering the defect;
   forming a second pattern of the first film by etching the first film from above the resist pattern and the protection pattern, the second pattern being a pattern resulting from the resist pattern and the protection pattern being transferred to the first film;
   removing the resist pattern and the protection pattern; and
   forming a third pattern of the first film by etching the first region of the second pattern of the first film with a charged particle beam.

2. The pattern formation method according to claim 1, wherein the resist pattern includes a second region of the predetermined region, the second region having a defect which size is larger than a desired size, and
   a position in which the protection pattern is to be formed is set in accordance with a position and a size of the defect of the first region and a position and a size of defect of the second region.

3. The pattern formation method according to claim 1, further comprising:
   etching, after the third pattern of the first film has been formed, the top surface of the substrate using the third pattern as a hard mask.

4. The pattern formation method according to claim 1, wherein:
   the protection pattern is formed by dropping protectant onto the first region in an ink-jet manner.

5. The pattern formation method according to claim 4, further comprising:
   setting a position in which the protection pattern is to be formed in accordance with a minimum size in which the protectant is formed in the ink-jet manner and a minimum size of a circular region necessary to encompass the defect in the first pattern.

6. The pattern formation method according to claim 4, wherein the protectant is a resist.

7. The pattern formation method according to claim 1, wherein the protection pattern is formed on the first pattern by reacting a process gas with a charged particle beam.

8. The pattern formation method according to claim 7, wherein the protection pattern is a metal film or a metal-oxide film.

9. The pattern formation method according to claim 1, further comprising:
   setting a center of a position in which the protection pattern is to be formed such that the protection pattern covers the first pattern entirely and such that the protection pattern covers the resist pattern as widely as possible.

10. A semiconductor device manufacture method, the method comprising:
    forming a first resist pattern on a first film formed on a first substrate, the first resist pattern including a first pattern in a predetermined region, the first pattern containing a defect in a first region;
    forming a protection pattern on the first pattern and the first film, the protection pattern being formed in the first region and covering the defect;
    forming a second pattern of the first film by etching the first film from above the first resist pattern and the protection pattern, the second pattern being a pattern resulting from the first resist pattern and the protection pattern being transferred to the first film;

forming a third pattern of the first film by etching the first region of the second pattern of the first film with a charged particle beam;

forming, a second resist pattern on a second substrate by pressing, the first substrate to which the third pattern of the first film is formed onto a resist formed on a second substrate; and forming a fourth pattern of the second substrate by etching the top surface of the second substrate from above the second resist pattern.

* * * * *